United States Patent [19]
Yamazaki

[11] 3,798,061
[45] Mar. 19, 1974

[54] METHOD FOR FORMING A SINGLE-LAYER NITRIDE FILM OR A MULTI-LAYER NITRUDE FILM ON A PORTION OF THE WHOLE OF THE SURFACE OF A SEMICONDUCTOR SUBSTRATE OR ELEMENT

[76] Inventor: Shumpei Yamazaki, 20, No. 7, 1-chome Shinkawa, Shizuoka, Japan

[22] Filed: July 13, 1970

[21] Appl. No.: 56,208

Related U.S. Application Data

[63] Continuation of Ser. No. 672,402, Oct. 2, 1967, abandoned.

[30] Foreign Application Priority Data

Oct. 17, 1967 Japan .................................. 42-2077
Oct. 7, 1966 Japan .................................. 41-66000

[52] U.S. Cl. ......... 117/213, 117/106 R, 117/106 A, 117/215, 117/DIG. 12, 317/235; 317/46.5
[51] Int. Cl. .......................... B44d 1/16, B44d 1/18
[58] Field of Search ........... 117/106 R, 106 A, 215, 117/212, 118, 213; 317/235, 46.5; 156/17

[56] References Cited

UNITED STATES PATENTS

| | | | |
|---|---|---|---|
| 3,147,152 | 9/1964 | Mendel | 148/1.5 |
| 3,385,729 | 5/1968 | Larchian | 117/200 |
| 3,422,321 | 1/1969 | Tombs | 117/106 |
| 3,465,209 | 9/1969 | Denning et al. | 117/DIG. 12 |
| 3,597,667 | 8/1971 | Horn | 317/235 R |

FOREIGN PATENTS OR APPLICATIONS

| | | | |
|---|---|---|---|
| 1,193,766 | 1/1961 | Germany | 117/201 |

OTHER PUBLICATIONS

Klein, D. L. & D'Stefan, D. J., Controlling Etching of Silicon in the HF–$HNO_3$ System, in Journal of the Electrochem. Soc. 109(1): p. 37–41, Jan. 1962.

Yamazaki, S. et al., Silicon Nitride By Using Stain Films On Silicon, in Chemical Abstracts 66: p. 109488d, 1966.

*Primary Examiner*—Cameron K. Weiffenbach
*Attorney, Agent, or Firm*—Bauer & Amer

[57] ABSTRACT

The process for preparing an electrically insulating nitride surface coating on a silicon or germanium semiconductor substrate comprising oxidizing the surface of a silicon or germanium semiconductor to form a stain film on said surface; nitriding said oxide stain film surface by heating to a temperature above 600°C in a reactive atmosphere comprising gaseous nitrogen, ammonia or hydrazine and applying ultraviolet light to said surface whereby a chemically and physically stable electrical insulating nitride surfaced semiconductor is formed. The invention also includes a process for preparing a multi-layer nitride surface coating on a silicon or germanium substrate in which the first layer is formed as set forth in the preceding sentence and then one or more additional layers are formed by heating the semiconductor having the aforesaid first layer with a gaseous mixture of (i) a silicon compound selected from the group consisting of silicon halide and silane and (ii) a compound selected from the group consisting of nitrogen, ammonia and hydrazine to form a silicon nitride surface on said nitride surfaced semiconductor. The invention also includes the nitride surfaced semiconductor which may be produced by the foregoing processes.

8 Claims, No Drawings

METHOD FOR FORMING A SINGLE-LAYER NITRIDE FILM OR A MULTI-LAYER NITRUDE FILM ON A PORTION OF THE WHOLE OF THE SURFACE OF A SEMICONDUCTOR SUBSTRATE OR ELEMENT

This application is a continuation of copending application Ser. No. 672,402, filed Oct. 2, 1967, now abandoned.

BACKGROUND OF THE INVENTION

Semiconductors having stain films formed on their surfaces have been known in the art and have been widely employed as elements in the manufacture of field effect-type transistors, diodes and integrated circuits. However, since the stain films are generally chemically unstable and accordingly, such stain films are not perfectly satisfactory as the surface passivation for semiconductor substrates. Thus, in order to provide the satisfactory surface passivation for the semiconductor substrates by using such stain films, the stain films have been subjected to heat, or to light at relatively low temperatures ranging from room temperature to 100°C in a reactive gas atmosphere comprising air so as to cause a chemical reaction to take place between the stain films and the air and to convert the stain films into oxide films. However, thus formed oxide films were not necessarily fine in structure and were still chemically unstable. Therefore, when the such oxide films on semiconductors were employed in transistors, for example, the transistors were not free from variation in the electrical characteristics due to deterioration of their performance with the lapse of time.

Therefore, means which can eliminate the above defects of the conventional semiconductors have been long and strongly called for in the art. In order to meet such desire by the industry an improved method has been proposed in which the stain film formed on a semiconductor is converted into a nitride film. According to this method since the stain film contains a great amount of free silicon atoms which are chemically unstable, the stain film formed on the semiconductor substrate is placed in an atmosphere of purified ammonia, hydrazine, or nitrogen gas and the stain film on the semiconductor is then heated or subjected to light in presence of the reactive gas so as to cause a reaction between the stain film and reactive gas thereby to nitride the stain film. When the stain film is treated in the manner mentioned just above, mobile impurities, that is, ion and the like which adversely affect the electrical characteristics of the device, are removed from the interface between the nitrided layer and the semiconductor substrate. Because the formation of the stain film is made by chemical etching of the semiconductor substrate, this etching process eliminates the impurities and a quite clean interface is produced. Such a nitrided film has been found far superior to any of the conventional protective coatings for semiconductor substrates. When the stain film on a semiconductor is treated in the manner mentioned just above, the interface between the nitrided film and substrate can maintain their inherent desirable state and have a very high dielectric breakdown voltage.

Nevertheless, our experiments have shown that it is not possible to increase the thickness of the nitrided film on a semiconductor above 1,000 A except by the electrochemically staining method such as anodic oxidation in the solution of hydrofluoric acid. Therefore, even if the breakdown voltage of the nitrided film per unit thickness is very high, such a nitrided film is not in fact perfectly satisfactory.

In order to further enhance the industrial value of the nitride film forming method as referred to just above, it is preferable to form another nitride film on the previously formed nitride film on the semiconductor substrate so as to form a multi-layer electrically insulating nitride film on the substrate and it has been found that such a multi-layer nitride film can effectively eliminate just one inherent defect of the nitride film by using the stain film.

SUMMARY OF THE INVENTION

One aspect of the present invention is based on the idea that if the stain film formed on a portion or the whole of the surface of a semiconductor substrate is subjected to heat or irradiated with light while the semiconductor substrate is being maintained in an ammonia, hydrazine or nitrogen gas reaction atmosphere so as to cause a chemical reaction to take place between the stain film and reactive ammonia, hydrazine or nitrogen gas, the stain film can be converted into a dielectric nitride film which is chemically and physically stable and has a fine structure, and such a nitride film can satisfactorily serve for the purpose of surface passivation of the semiconductor substrate or element.

Another aspect of the present invention is based on the idea that if another or second nitride film is formed on the first nitride film previously formed on the semiconductor substrate so as to form a multi-layer insulating nitride film which can effectively eliminate the defects inherent to the conventional stain films.

Therefore, one object of the present invention is to provide a method for converting the stain film formed on a semiconductor substrate into a nitride film.

Another object of the present invention is to provide a method for providing a multi-layer insulating nitride film on a semiconductor substrate by forming another nitride film on the first nitride film previously formed on the substrate.

According to one aspect of the present invention, there is provided a method for forming a nitride film on a semiconductor substrate in which the stain film conventionally formed on a portion or the whole of the surface of a semiconductor substrate is heated or both heated and light is applied while the substrate is being maintained in a reactive atmosphere comprising nitrogen or ammonia gas so as to cause a chemical reaction between the stain film and gas, whereby the stain film may be converted into an electrically insulating nitride film which can endure heat up to several hundred degree centigrade and is chemically and physically stable with little variation in performance with the lapse of time.

According to another aspect of the present invention there is also provided a method for forming a multi-layer nitride film on a semiconductor substrate in which the stain film conventionally formed on a portion or the whole of the surface of a semiconductor substrate is heated or both heated and light is applied while the substrate is being kept in a reactive atmosphere comprising nitrogen, hydrazine or ammonia gas so as to cause a chemical reaction to take place between the stain film and gas whereby the stain film is converted into a nitride film and said nitride film is caused to react with a mixture of silicon halide and hydrazine or ammonia gas, or a mixture of silane and hydrazine or ammonia gas by the so-called gas phase reaction process or alternatively caused to spatter in ammonia or nitrogen gas atmosphere by the so-called spattering process whereby a second nitride film may be formed on the first nitride film. Preferred Embodiments

PREPARATION OF SINGLE-LAYER NITRIDE FILM

The surface of a semiconductor substrate or element formed of silicon or germanium is rinsed by an ultrasonic wave rinsing machine and the rinsed surface is exposed to a mixed solution comprising hydrofluoric acid and nitric acid or hydrogen peroxide, or a vapor mixture comprising hydrogen fluoride and ozone, nitric oxide or nitrogen peroxide for a suitable period of time (in the case the mixed solution, the time period is 1 minute to 30 minutes at room temperature and several minutes to 1 hour in the vicinity of 0°C, while in the case of the mixed vapor, the time period is several seconds to 20 minutes at room temperature and is 10-odd seconds to 30 minutes at 0°C) whereby a colorful film (a stain film) is formed on the surface of the substrate. Since the stain film formed on the surface of the silicon substrate, for example, in the above manner is still chemically and physically unstable, it is possible to nitride the stain film by heating in purified ammonia gas atmosphere maintained in an electric furnace at a temperature above 600°C for about 1 hour (in this case if ultraviolet light are simultaneously applied on the stain film while the heating step is being performed, the heated temperature may be a relatively low one in the vicinity of 100°C). The result of an analysis of this film by infrared spectroscopy showed that the stain film became a different film from the conventionally known oxide film, and this is nitride film.

When the above nitriding reaction is performed, if a very small amount of oxygen or water vapor is added to the ammonia, hydrazine or nitrogen gas reaction atmosphere (in an amount of about one ten-thousandth of that of the ammonia, hydrazine or nitrogen gas by volume), a film which comprises a mixture of a silicon oxide and nitride and in which a silicon semiconductor is employed as the substrate can be obtained.

In a prior art method for forming a protective film for the surface of a silicon-made semiconductor substrate, a silicon dioxide film was generally formed on the surface of the substrate by heating the substrate in an oxygen or water vapor atmosphere while the substrate was being prepared from blank material. However, although the thus formed silicon dioxide film has a fine structure, the desired properties of the film inevitably changes with the lapse of time and accordingly, the silicon dioxide film was not perfectly satisfactory for the purpose of surface passivation of the silicon semiconductor substrate.

On the other hand, the film formed by the novel method as mentioned above is a nitride film which not only possesses the excellent electric properties inherent to the prior art silicon dioxide film, but also has other various desired properties which all but change even with the lapse of time. Thus, it will be clear that the present invention is applicable to the production of films for the surface passivation of transistors such as field effect-type transisters, diodes such as rectifiers and integrated circuits as well as protecting films for elements.

PREPARATION OF MULTI-LAYER NITRIDE FILM

A semiconductor substrate or element made of silicon or germanium is rinsed with pure water and the rinsed surface of the substrate is further rinsed with alcohol which is followed by the esterification of the rinsed surface. Thereafter, the thus treated surface of semiconductor substrate is placed into a glass vessel, for example, in which nitric acid is contained, and the substrate is then boiled for a period of time from 10 to 20 minutes so as to form a thin oxide film on the surface of the substrate thereby to render the surface into a hydrophilic surface. The pre-treated semiconductor substrate is exposed to a gas mixture comprising hydrogen fluoride and an oxidization agent such as ozone, dinitrogen monoxide, nitric oxide, nitrogen peroxide or in a ratio of 1 part of oxidization agent per a few hundreds parts of hydrogen fluoride for a period of time ranging 5 seconds to 30 minutes, or alternatively the substrate is immersed in a mixed solution comprising hydrofluoric acid and either nitric acid and/or hydrogen peroxide as an oxidization agent or agents in a ratio of 1 part of oxidization agent or agents per a few hundreds parts of hydrofluoric acid for a period of time ranging 1 minute to 30 minutes whereby a stain film is formed on the surface of the substrate. These staining processes are the same as those employed for preparation of single-layer films. Immediately after the formation of the stain film, the substrate having the stain film formed thereon is placed into a reaction tube which is filled with highly purified ammonia gas and heated at a temperature ranging 600°C to 1,000°C for a period of time ranging a few minutes to 1 hour (if necessary or desired, light may be applied to the stain film while the reaction is being performed). And when it is desired to perfectly nitride the stain film, the heating time may be extended to a range from 1 hour to 2 hours or the heating temperature may be increased to a range from 1,000°C to 1,200°C. Then, for example, a flow of silane or silicon halide is introduced into the reaction tube with a carrier gas such as hydrogen in which the nitrified film by using the stain film on the semiconductor is present, in an amount of one half of that of the ammonia gas by volume so as to cause a reaction to take place between the silane or silicon halide and ammonia or hydrazine gas resulting in formation of silicon nitride. In addition to this halide, it is preferable to use a little amount of titanium or vanadium halide together with a carrier gas such as hydrogen gas. The thus formed silicon nitride gradually deposits itself as a layer on the nitrided film formed from the stain film. When the thickness of the silicon nitride layer has reached the thickness range from 500 to 6,000 A, the introduction of the silane or silicon halide into the reaction tube is halted. Thereafter, the semiconductor substrate having a multi-layer of nitride film formed by nitriding the stain film and a silicon nitride layer is heated in the reaction tube in presence of the ammonia or hydrazine gas at a temperature ranging from 800°C to 1,000°C for from a few minutes to 30 minutes and then cooled therein. The cooled product is then taken out of the reaction tube.

The electric properties of the formed multi-layer film formed in the above manner was determined. The result of the determination shows that although the multi-layer film had the dielectric breakdown voltage of $5 \times 10^6$ V/cm which was lower than that of the stain film itself which was $10^7$ V/cm, the specific resistance of the multi-layer film was $5 \times 10^{14}\Omega$ cm which was higher than that of the stain film which was from $10^9$ to $10^{11}\Omega$cm. This improved specific resistance of the multi-layer film is not only important as a protective for a high power semiconductor element, but makes a semiconductor element having such a multi-layer film thereon applicable to field effect-type transistors and integrated circuits.

While only two preferred embodiments of the invention have been described in detail it will be understood that they are for the purpose of illustration only.

I claim:

1. The process for preparing an electrically insulating nitride surface coating on a silicon or germanium semiconductor substrate comprising treating the surface of a silicon or germanium semiconductor by contacting said surface with a mixture of HF and at least one oxidizing agent selected from the group consisting of nitric acid, dinitrogen monoxide, nitrogen peroxide, hydrogen peroxide and ozone to form a stain film on said surface;

nitriding said stain film surface by heating to a temperature above 600°C in a reactive atmosphere comprising (i) gaseous nitrogen, ammonia or hydrazine and (ii) oxygen in an amount of about one ten-thousandth by volume of said nitrogen, ammonia and hydrazine and applying ultraviolet light to said surface while it is being heated to a temperature between 600°C and 1,200°C in said reactive atmosphere whereby a chemically and physically stable electrical insulating nitride surfaced semiconductor is formed.

2. The process of claim 1 wherein at least one silicon nitride layer is deposited on the nitride surfaced semiconductor produced by the process of claim 1, said silicon nitride layer being formed by heating said nitride surfaced semiconductor with a gaseous mixture of (i) a silicon compound selected from the group consisting of silicon halide and silane and (ii) a nitrogen compound selected from the group consisting of ammonia and hydrazine to form a silicon nitride surface on said nitride surfaced semiconductor.

3. The process of claim 2 wherein said gaseous mixture contains a titanium halide or a vanadium halide.

4. The process of claim 1 wherein said semiconductor is silicon.

5. The process of claim 4 wherein said silicon surface is pretreated by contact with boiling nitric acid prior to said treating step and wherein said treating step involves exposing said pretreated silicon to a gas mixture comprising hydrogen fluoride and at least one oxidizing agent selected from the group consisting of ozone, dinitrogen monoxide, nitric acid, and nitrogen peroxide.

6. The process of claim 5 wherein at least one silicon nitride layer is deposited on the nitride surfaced semiconductor produced by the process of claim 5, said silicon nitride layer being formed by heating said nitride surfaced semiconductor with a gaseous mixture of (i) a silicon compound selected from the group consisting of silicon halide and silane and (ii) a nitrogen compound selected from the group consisting of ammonia and hydrazine to form a silicon nitride surface on said nitride surfaced semiconductor, and wherein said gaseous mixture contains a small amount of a titanium halide or a vanadium halide.

7. The process of claim 4 wherein said silicon surface is pretreated by contact with boiling nitric acid prior to said heating step and wherein said treating step involves immersing said pretreated silicon in a solution comprising hydrofluoric acid and at least one oxidizing agent selected from the group consisting of nitric acid and hydrogen peroxide.

8. The process of claim 7 wherein at least one silicon nitride layer is deposited on the nitride surfaced semiconductor produced by the process of claim 7, said silicon nitride layer being formed by heating said nitride surfaced semiconductor with a gaseous mixture of (i) a silicon compound selected from the group consisting of silicon halide and silane and (ii) a nitrogen compound selected from the group consisting of ammonia and hydrazine to form a silicon nitride surface on said nitride surfaced semiconductor, and wherein said gaseous mixture contains a small amount of a titanium halide or a vanadium halide.

* * * * *